United States Patent [19]

Baker et al.

[11] Patent Number: 4,880,348

[45] Date of Patent: Nov. 14, 1989

[54] WAFER CENTRATION DEVICE

[75] Inventors: Gregory G. Baker; Edward F. Boyle, both of Gig Harbor, Wash.

[73] Assignee: Roboptek, Inc., Gig Harbor, Wash.

[21] Appl. No.: 50,951

[22] Filed: May 15, 1987

[51] Int. Cl.[4] .............................................. B65G 47/24
[52] U.S. Cl. ...................................... 414/783; 414/754
[58] Field of Search ....................... 414/754, 783, 757; 198/394; 406/87

[56] References Cited

U.S. PATENT DOCUMENTS

| | | | |
|---|---|---|---|
| 4,024,944 | 5/1977 | Adams et al. | 198/394 |
| 4,425,075 | 1/1984 | Quinn | 414/755 |
| 4,457,664 | 7/1984 | Judell et al. | 414/779 |
| 4,752,898 | 6/1988 | Koenig | 414/754 X |
| 4,770,600 | 9/1988 | Ishikawa | 414/754 X |

*Primary Examiner*—Frank E. Werner
*Assistant Examiner*—Janice L. Krizek
*Attorney, Agent, or Firm*—Christensen, O'Connor, Johnson & Kindness

[57] ABSTRACT

A device for centering an object and rotating it to a desired angular position relative to a discerning feature. The centration device is particularly adapted for use as a station in a semiconductor wafer handling apparatus, and includes a rotatably driven chuck on which a wafer may be placed by a robot manipulator arm. The perimeter of the wafer is rotated between a light source and a linear array of charge coupled device elements, casting a shadow on the light sensitive elements as the wafer is rotated. A processor connected to the charge couple devices and to an angular position encoder on a shaft of the chuck rotating the wafer is operative to collect data relating the displacement of the perimeter from a reference point to the angular position of the wafer. The processor determines from the data a distance over which the wafer should be shifted on the chuck to center it relative to the reference point. Once the robot manipulator arm has centered the wafer, a minimum displacement of a point on the perimeter corresponding to a flat or notch on the wafer is located and positioned at the desired angular orientation.

6 Claims, 5 Drawing Sheets

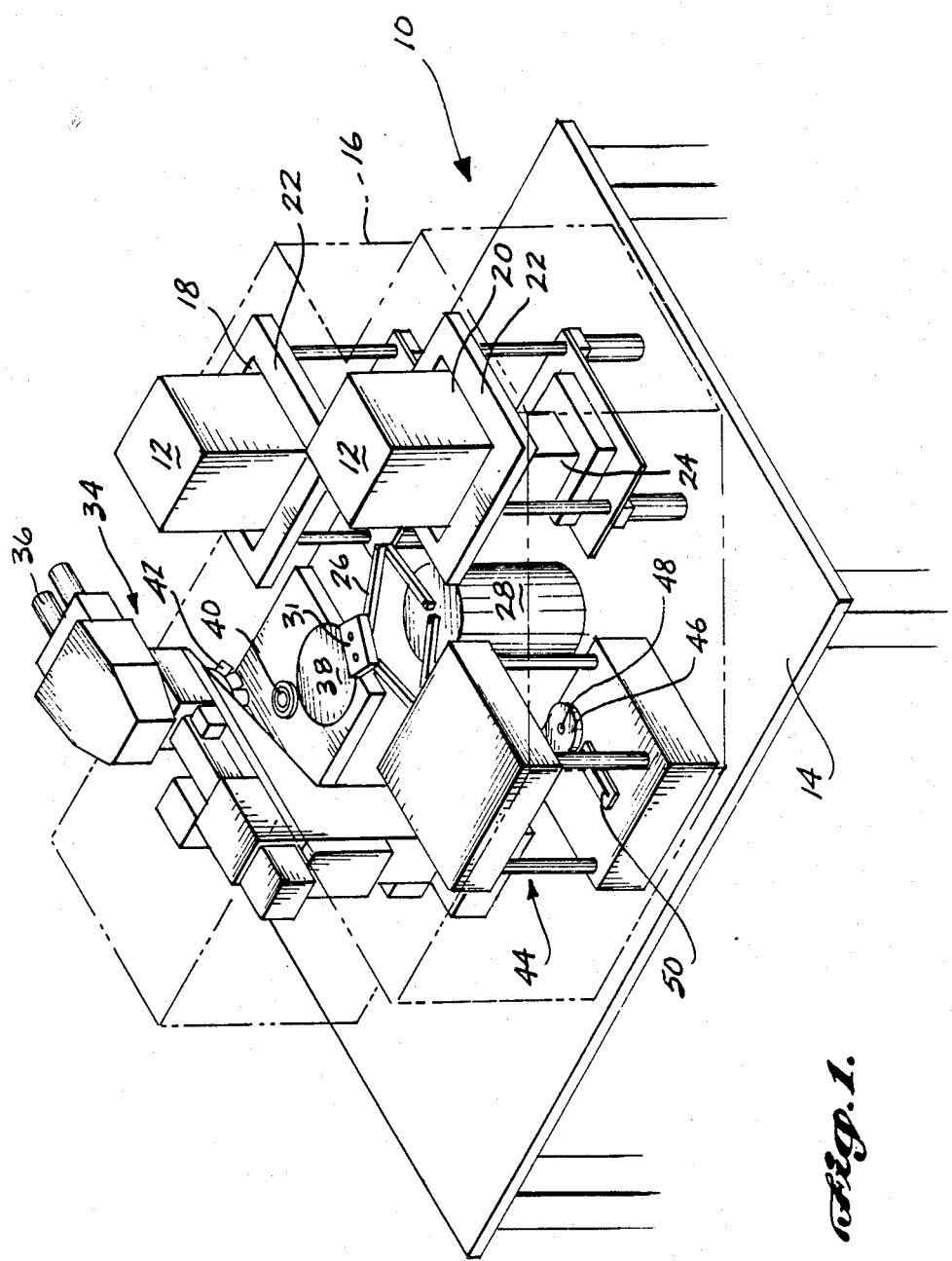

WAFER CENTRATION DEVICE

FIELD OF THE INVENTION

The present invention generally pertains to apparatus and a method for centering an object, and more specifically, to an apparatus for centering a wafer and angularly orienting a discerning feature on the wafer relative to a reference point.

BACKGROUND OF THE INVENTION

The steps involved in the manufacture of an integrated circuit include the slicing of a semiconductor crystal into thin wafers, polishing of the wafers, preparation of masks or reticles, oxidation of the wafers, doping of the semiconductor material comprising the wafers, and processing the wafers through circuit forming steps such as photolithography, etching, exposure, etc. Once the circuits have been formed on a wafer, the individual circuits are probed to confirm that they are functional, and the wafer is then cut into chips and the individual chips packaged. At any one of these steps in the manufacturing process, it may be necessary to visually inspect the wafers for imperfections. In the past, the manufacturing steps, including the inspections, have typically been carried out in a clean room from which dust and other airborne particles have been substantially excluded.

Recently a system has been designed to permit the handling of semiconductor wafers both inside and outside of clean rooms. The system incorporates a standardized mechanical interface, and is commonly referred to by the acronym SMIF. The SMIF system includes dust-proof boxes for the transport and storage of the wafers, and is described in detail in U.S. Pat. No. 4,746,256, and U.S. patent application Ser. No. 050,952, filed May 15, 1987. In the apparatus described therein, a canopy is provided to enclose a dust-free environment in which are disposed a plurality of workstations. At least one of the stations serves as a port through which wafers stacked inside a SMIF container are conveyed through the canopy. Additional stations may include a microscope for inspecting the wafers, an ion deposition apparatus, photolithography apparatus, chemical baths for treating the wafer, etc. A centrally disposed robot manipulator is provided to handle the individual wafers, conveying them from station to station. Since the wafers are extremely delicate and likely to be damaged by a conventional clamping manipulator, the robot manipulator includes a vacuum pad that engages the lower surface of an individual wafer, enabling the wafer to be safely lifted and moved about inside the canopy.

In handling semiconductor wafers for inspection and during the process by which integrated circuits are manufactured from the wafers, it is sometimes necessary to center a wafer relative to a reference point and to rotate it to bring a discerning feature into a desired angular orientation. The discerning feature may comprise either a flat or a notch provided at one side of the wafer that serves as an alignment reference for subsequent steps in the integrated circuit manufacturing process. In the case of rectangular wafers, it may be necessary to position the edges in a particular orientation. The wafers are not centered or aligned in the SMIF containers. Due to the variations in the dimensions of the wafers, the tolerance and the dimensions of the SMIF containers, and the clearance between the edges of the wafers and sides of the containers, the deviation from concentricity of disc-shaped wafers stacked in the containers is typically on the order of plus or minus three millimeters. However, should the flat of a wafer happen to be aligned with and proximate to a side of the container, the error in concentricity may exceed 8 millimeters. The flat or other discerning feature on wafers stacked in SMIF containers tends to be randomly oriented.

Mechanical devices, including edge guides and drop cones, are available for centering an object or at least aligning it with a vertical surface; however, such prior art devices may damage a fragile semiconductor wafer. Furthermore, since wafers may have a range of diameters from 3 to 8 inches, it is desirable that the centration process be somewhat universal in application to at least a limited range of wafer sizes, thus obviating the need for a different centration station in the wafer handling apparatus for each size or shape of wafer. The centration station should be readily accessed by the manipulator robot so that once a wafer has been centered and angularly oriented as desired, it may be readily moved to another station for further processing or inspection. In addition, the accuracy of the centration process should be less than or equal to the translation precision of the manipulator, and thus sufficient to meet the requirements for positioning a wafer for inspection, or prealigning it for more critical manufacturing processes.

SUMMARY OF THE INVENTION

In consideration of the requirements for a combined centration and angular orientation station as described hereinabove, the present invention was developed for use in a wafer handling apparatus. It comprises a rotatably driven support on which a wafer is positioned, the diametrical extent of the support being substantially less than that of the wafer so that a perimeter of the wafer extends beyond that of the support. A rotational axis of the rotatably driven support is coincident with a reference point about which the wafer is to be centered. The rotatably driven support includes an angular position sensor for producing a signal indicative of the angular position of the support about its rotational axis.

The apparatus further comprises an array of light sensors that are disposed adjacent to the rotatably driven support, each light sensor being operative to produce a signal corresponding to the intensity of light incident on it. A light source is provided to illuminate the wafer and the array of light sensors, and is disposed so that the perimeter of the wafer is intermediate the light source and the array of light sensors and casts a shadow on the sensors.

Also disposed adjacent the rotatably driven support is a manipulator adapted to lift the wafer from the support and to reposition it thereon. Control means connected to the array of light sensors, the angular position sensor, the rotatably driven support, and the manipulator are responsive to the signals produced by the angular position sensor and the array of light sensors. The control means are operative to cause the rotatably driven support to rotate so that substantially the entire perimeter of the wafer passes between the light source and the array of light sensors. In response to the signals produced by the light sensors in the array, and by the angular position sensor, the control means are operative to determine the angular position of the rotatably driven support where the perimeter of the wafer is at one of a maximum and a minimum displacement relative to the reference point. In proportion to the one of the maximum and minimum displacements, a distance is determined by the control means over which the wafer should be moved to bring its center into coincidence with the reference point. The control means then cause the manipulator to lift the wafer and to move it the determined distance prior to returning it to the support.

The wafer includes a discerning feature on its perimeter which may be positioned at a desired angular orientation. Following centration of the wafer, the control means are operative to determine the angular position of the discerning feature in response to the signals produced by the angular position sensor and the array of light sensors, and to cause the rotatably driven suspport to rotate the wafer so that the discerning feature is at a desired orientation. Once centered and oriented as desired, the wafer may be moved by the manipulator to another station.

Depending upon the accuracy required, the centration process may be repeated one or more times. The accuracy with which the wafer may be centered and oriented is generally a function of the resolution of the array of light sensors and the precision with which the manipulator is able to move the wafer from one point to another.

BRIEF DESCRIPTION OF THE DRAWINGS

FIG. 1 is a perspective view of a wafer handling apparatus incorporating the present invention.

DESCRIPTION OF THE PREFERRED EMBODIMENTS

Figure 3:
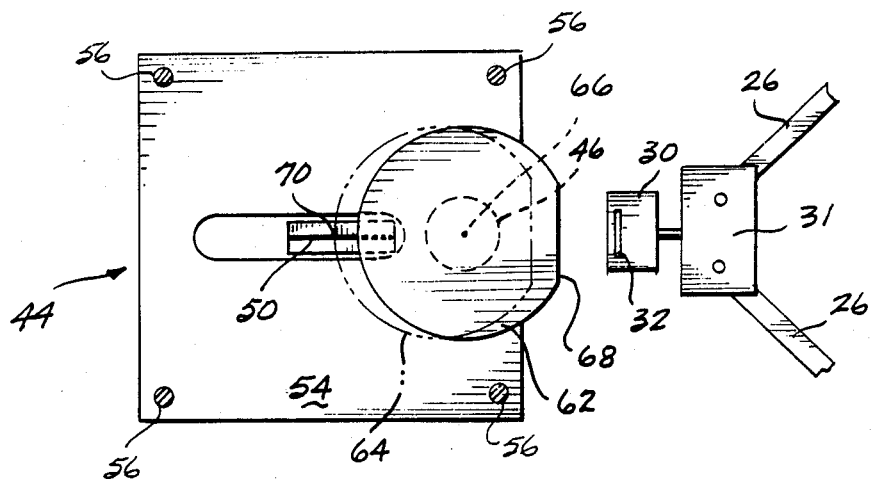
FIG. 3 is a cross-sectional plan view of the centration station, taken along section lines 3—3 of FIG. 2.

With reference to FIG. 1, a wafer handling apparatus generally denoted by reference numeral 10 is illustrated in perspective view. Wafer handling apparatus 10 is described in detail in U.S. Pat. No. 4,746,256, entitled "Apparatus for Handling Sensitive Material Such As Semiconductor Wafers," the specification of which is hereby in its entirety incorporated herein by reference. The wafer handling apparatus shown in FIG. 1 is merely illustrative of a particular application of the present invention to the centration of semiconductor wafers. Such wafers are conveyed in standardized mechanical interface (SMIF) boxes, and are normally not centered or angularly oriented as they enter apparatus 10.

FIG. 1 shows the covers 12 of two such SMIF carriers resting on a canopy 16. Canopy 16 is drawn with dash lines to show that it is constructed of a transparent material such as glass or plastic. A suitable table 14 is provided as a base for wafer handling apparatus 10, and together with canopy 16, defines a dust-free environment inside of which are disposed a plurality of workstations for handling, processing, and inspecting semiconductor wafers. Two such workstations correspond to ports 18 and 20, disposed on the top surface of canopy 16. Flanges 22 of SMIF covers 12 overlie the edges of ports 18 and 20 and prevent air movement into the enclosed space.

Ports 18 and 20 provide means for moving semiconductor wafers from SMIF boxes 12 into canopy 16. For example, as shown in FIG. 1, a SMIF carrier 24 has been introduced through port 20, and is shown inside canopy 16 after it has been lowered from inside its associated SMIF box 12. Although not illustrated, carrier 24 includes a plurality of slots disposed along the interior of its vertical sides which define shelves on which the semiconductor wafers are stacked. Once carrier 24 has been lowered inside canopy 16, the semiconductor wafers may be withdrawn from the shelves and moved about from station to station by a robot manipulator comprising two articulated arms 26 connected to an actuator base 28 that is centrally disposed on table 14.

Figure 2:
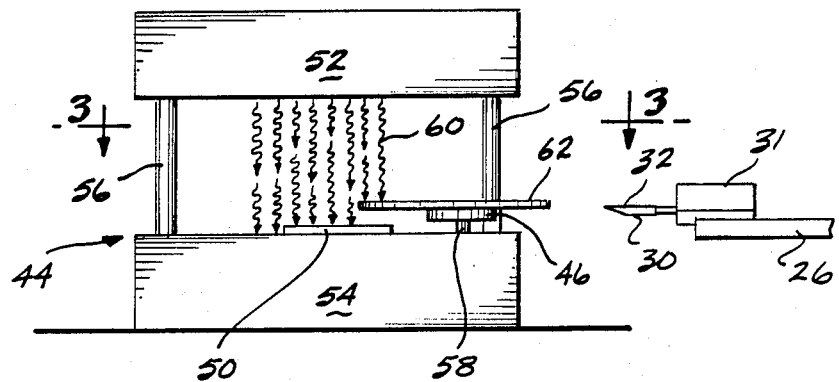
FIG. 2 is a side elevational view of a wafer centration station.

Referring to FIGS. 2 and 3, arms 26 extend outwardly of base 28 and are connected at their other end to a terminal pivot block 31. A suction pad 30 having a vacuum port 32 is attached to the center of pivot block 31. Suction pad 30 is adapted to underlie a semiconductor wafer and to engage it as a vacuum is applied through port 32. Because of the central disposition of actuator base 28 on table 14, manipulator arms 26 are able to pivot about between each of the stations, moving the wafers with a relatively high degree of accuracy from station to station. In the preferred embodiment, manipulator arms 26 are capable of placing a semiconductor wafer at a desired location with a precision of approximately plus or minus 10 microns.

In addition to the stations corresponding to ports 18 and 20, canopy 16 encloses two other stations in the illustrated wafer handling apparatus 10. One of the stations is used for inspecting semiconductor wafers and includes a microscope 34, and a binocular eye piece 36 that extends outside canopy 16. A motor driven turret containing five objective lenses 42 is adapted to inspect a wafer that is placed on a stage which includes a chuck 40. Chuck 40 may be connected to a vacuum source such that material positioned on the chuck can be securedly held while it is translated horizontally on the stage of microscope 34. As shown in FIG. 1, a wafer 38 is being moved by manipulator arms 26 toward chuck 40 for microscopic inspection of its surface.

Wafer handling apparatus 10 further includes a centration station generally represented by reference numeral 44, and shown in further detail in FIGS. 2 and 3. Centration station 44 includes a wafer handling chuck 46. Chuck 46 is rotatably driven by an electric motor (not shown) enclosed within a base 54, and is connected to the electric motor by means of a drive shaft 58 having an optical position encoder (also enclosed within base 54 and therefore not shown) which is operative to determine the angular position of shaft 58 and attached chuck 46. A vacuum port 48 is disposed in the center of chuck 46 and is operative to engage an object resting on the chuck, thereby holding the object in place as chuck 46 is rotated. Disposed immediately adjacent chuck 46 on top of base 54 are charge couple devices 50 comprising a linear array of light sensitive elements. Charge coupled devices 50 are radially aligned with the center of chuck 46. An illumination hood 52 is disposed above base 54, supported by four columns 56. Hood 52 includes a light source (not shown) which in the preferred embodiment is a plurality of light emitting diodes (LED's), aligned with the charge couple devices 50 and oriented so that the light 60 they produce is directed toward and illuminates the exposed upper surface of the charge couple devices 50. It is anticipated that other types of light sources may serve equally well for this application including incandescent bulbs; however, it may be necessary to include an optic system for each of the bulbs to achieve the desired directivity required to precisely image the edge of an object interposed between the light sources mounted inside hood 52 and the charge couple devices 50. The edge of any such interposed object should cast a very sharp shadow on the linear array of charge couple devices 50 so that the edge may be precisely resolved.

As shown in FIGS. 2 and 3, a semiconductor wafer 62 comprising a generally round disc having a flat 68 has been positioned by robot manipulator arms 26 so that it rests on chuck 46. A dash line 64 in FIG. 3 indicates an initial disposition of wafer 62, showing that it is not centered relative to a reference point 66, disposed at the center and on the rotational axis of chuck 46. After wafer 62 is centered relative to reference point 66, all of its perimeter except for flat 68 is substantially equadistant from the reference point as shown by the solid perimeter line of the wafer.

Figure 6:
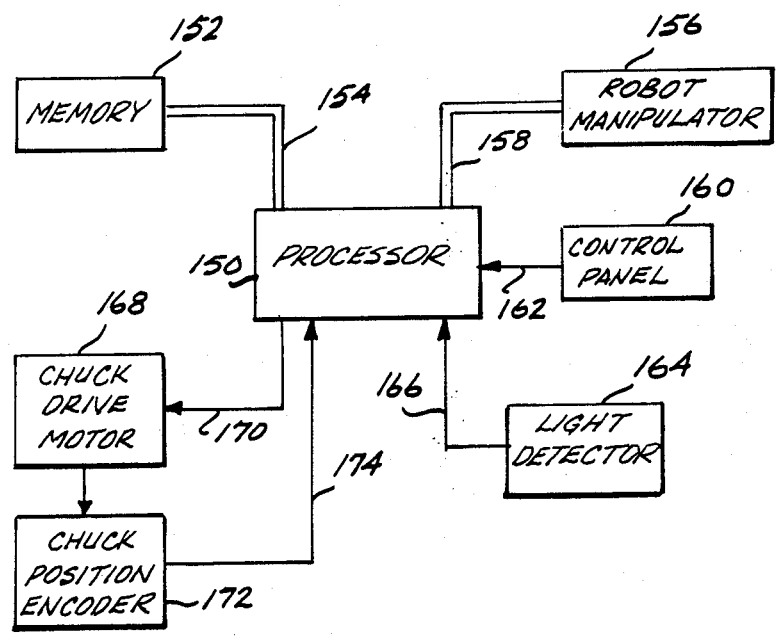
FIG. 6 is a block diagram illustrating the control for the centration station.

Turning now to FIG. 6, a block diagram illustrates the components of a control for centration station 44 which enable an object placed on chuck 46 to be centered relative to reference point 66 by robot manipulator arms 26. The control includes a processor 150 that is connected to an electronic memory block 152 by address/data transfer lines 154. Memory 152 comprises read only memory (ROM) and random access memory (RAM) in which stored the binary data representing a machine language program used to implement an aglorithm for centering the object on chuck 46, amd for storing temporary data as necessary to carry out the program. Robot manipulator arms 26 are controlled by processor 150 as indicated by block 156, labeled Robot Manipulator in FIG. 6. The Robot Manipulator block 156 is connected to the processor by a plurality of control lines 158 over which are conveyed signals to cause manipulator arms 26 to engage and move an object. A control panel 160 is provided for operator input, as for example to initiate the centration process, and is connected to the processor by electrical lines 162.

The components of centration station 44 which are associated with base 54 are also connected to processor 150 and include block 164 referred to as Light Detector which in the preferred embodiment is the array of charge couple devices 50. Block 164 is connected to processor 150 by means of electrical leads 166. Chuck 46 is controlled by processor 150 as indicated by the inclusion of block 168 labeled Chuck Drive Motor connected to the processor by leads 170. Similarly, the optical position encoder associated with drive shaft 58 is labeled Chuck Position Encoder in block 172, and is connected to the processor by leads 174.

Figure 4:
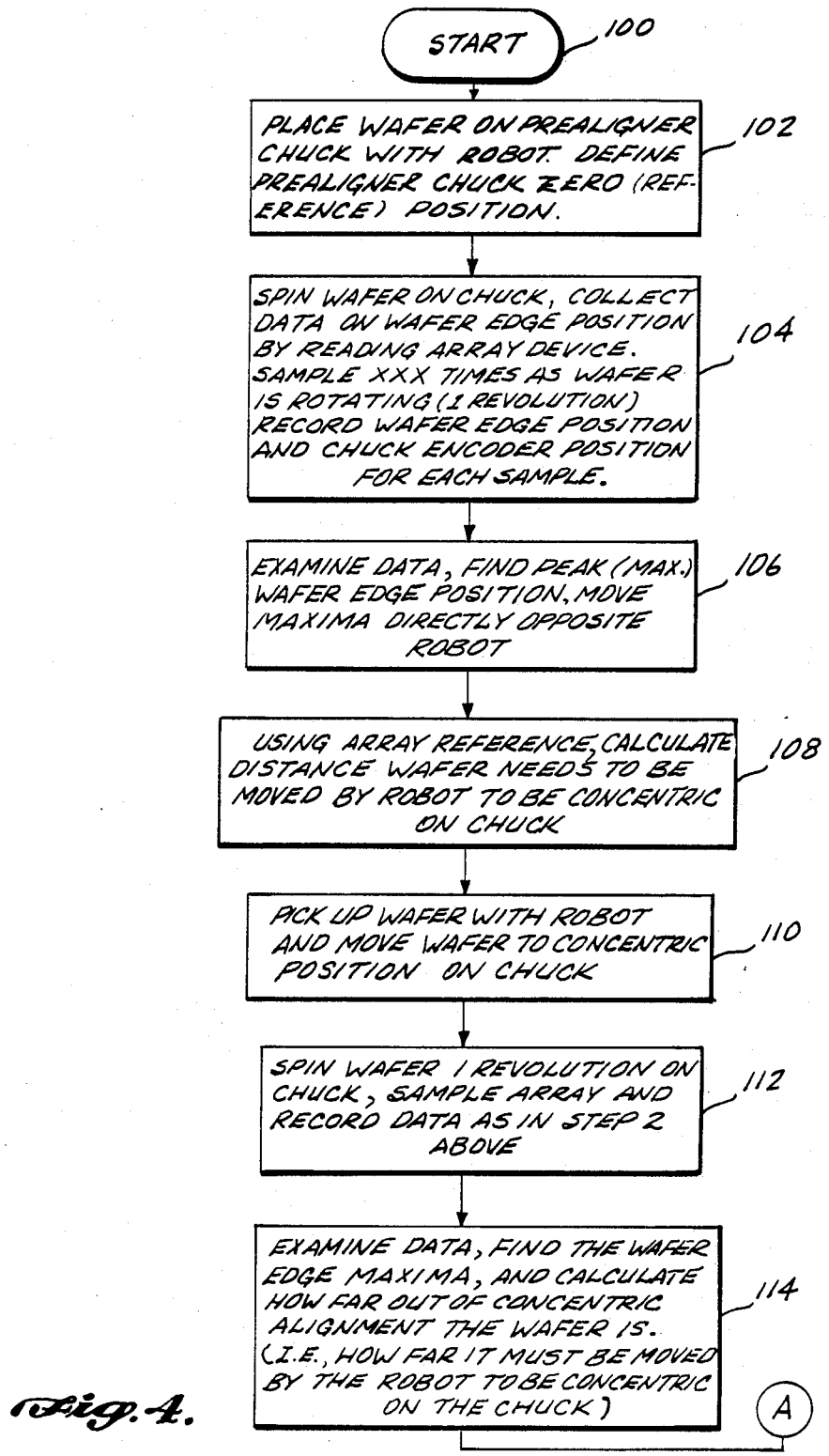
FIG. 4 is a flow chart describing a first portion of the program software required to implement centration of a wafer.
Figure 5:
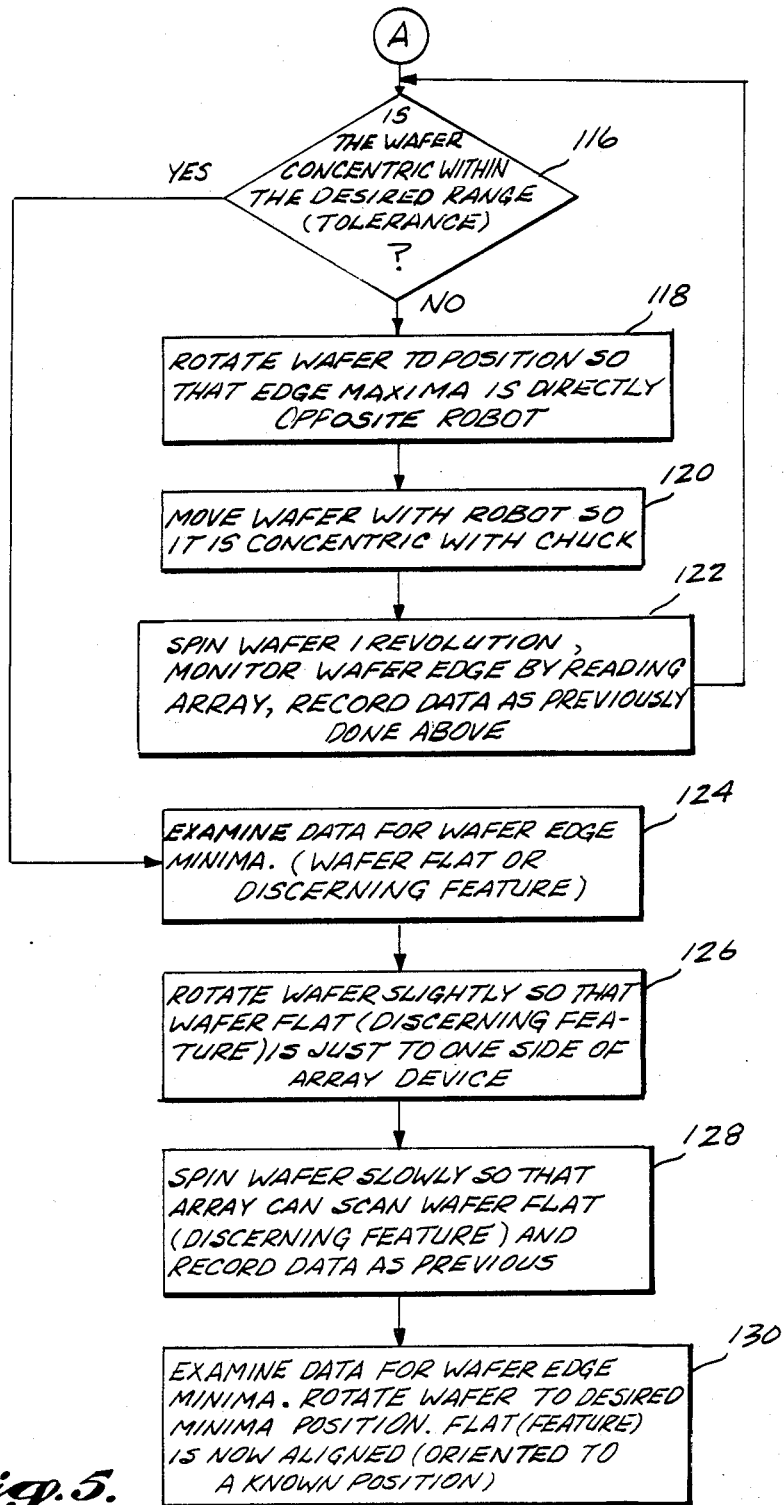
FIG. 5 is a flow chart describing a second portion of the program of FIG. 4.

The algorithm implemented by processor 150 and stored in memory 152 is illustrated in a flow chart shown in FIGS. 4 and 5. The algorithm starts with block 100 in FIG. 4, proceeding immediately to block 102 wherein robot manipulator arms 26 are caused by processor 150 to engage wafer 62 and to position it on chuck 46. When initially engaged by manipulator arms 26, disc 62 may be disposed at one of the other stations within wafer handling apparatus 10, as for example within SMIF carrier 24, resting on one of the internal shelves. Due to the requirement for providing a clearance between the perimeter of the wafer and the internal sides of carrier 24, wafer 62 is likely not centered within carrier 24 and is not oriented relative to any reference. The purpose of centration station 44 is thus to center wafer 62 relative to reference point 66 so that the wafer may be moved to a subsequent processing or inspection station and there positioned with the required precision relative to the location of its center and its angular orientation. The degree of precision with which this centration process may be accomplished is generally sufficient for inspection and for placement of a disc within a SMIF carrier; however, it may not be sufficiently precise for certain processes that must be carried out to manufacture integrated circuits from the wafer. Nonetheless, centration station 44 serves to prealign and angularly orient the wafer so that other apparatus may accomplish the final centration and orientation alignment with greater precision. For this reason, the algorithm described in FIGS. 4 and 5 is referred to therein as a prealignment process.

Following positioning of wafer 62 on chuck 46 by manipulator arms 26 as defined in block 102, processor 150 implements block 104, causing chuck 46 to rotate the wafer so that its entire perimeter passes over charge couple devices 50, casting a shadow thereon. Charge couple devices 50 produce a signal corresponding to the incident light intensity for each of the elements in the array, in effect producing an image of the edge of wafer 62 as it is rotated over these elements, and thus providing a signal input to processor 150 corresponding to data on the wafer edge position about reference point 66 that is related to the angular position of chuck 46 as it rotates. Processor 150 stores this data in memory 152, and in block 106, examines the data to find the point maximum displacement 70 on the perimeter of wafer 62 relative to reference point 66 during the rotation of the wafer. Based on the maximum displacement, in block 108, processor 150 calculates the distance that wafer 62 should be moved by manipulator arms 62, and rotates chuck 46 to place the point of maximum displacement to directly opposite the robot manipulator suction pad 30.

In calculating the distance which wafer 62 should be moved, processor 150 may subtract a known radius for wafer 62 (possibly input by an operator via control panel 160) from the maximum displacement 70 of the perimeter from the reference point 66, and divide the result by 2. Alternatively, processor 150 may compare the displacement from the reference point of points on the perimeter disposed at opposite sides of wafer 62 90° from the point of maximum displacement 70 and use the greater of the two distances as the wafer radius for use in determining the distance wafer 62 should be moved to center it on reference point 66. Thus, if the flat 68 is disposed at 90° to the maximum displacement 70, the displacement from point 66 of the opposite side would provide a reference radius for the above described calculation.

In block 110, processor 150 causes manipulator arms 26 to move suction pad 30 underneath wafer 62 and to engage it by an applied vacuum through suction port 32 so that it may be repositioned by the distance calculated in the preceding step, block 108. After wafer 62 has been repositioned on chuck 46, in block 112, the wafer is again rotated by chuck 46 so that its perimeter passes between the light source and the charge couple device 50, blocking a portion of light 60 that illuminates the charge couple device. Processor 150 again samples the data related to the image signal produced by charge couple device 50 relative to the angular position signal produced by the angular position encoder associated with drive shaft 58. In block 114, processor 150 examines the data produced by the second rotational sample, determines the wafer edge maximum displacement, and calculates how far the wafer must be moved to bring it into concentricity with reference point 66, as previously described.

Turning now to FIG. 5, in block 116, processor 150 determines if the wafer concentricity is within the desired range, i.e., whether wafer 62 has been centered with the required tolerance. If not, in block 118, processor 150 again rotates the wafer to position it so that a point 70, the maximum displacement of the perimeter from the reference point 66, is positioned directly opposite robot suction pad 30. Thereafter, robot manipulator arms 26 move suction pad 30 to lift wafer 62 and reposition it upon chuck 46, shifting it by the calculated distance. In block 122, the data collection process is repeated as chuck 46 rotates wafer 62, and the decision in block 116 is repeated to determine if the wafer has been centered within the required tolerance.

Assuming that wafer 62 has been properly centered, control logic moves from block 116 to block 124, wherein processor 150 examines the data it has collected to determine the wafer edge minima, i.e., the point on the perimeter which is at a minimum displacement from reference point 66. Clearly the point of minimum displacement will be at the center of flat 68 on wafer 62. Processor 150 then causes wafer 62 to be rotated slightly by chuck 46 so that flat 68 is positioned to one side of charge couple devices 50. Thereafter, in block 128, wafer 62 is slowly turned on chuck 46 so that charge couple devices 50 can scan the wafer flat 68, enabling processor 150 to collect data relating the displacement of points along flat 68 from reference point 66 to the angular orientation of the wafer. In block 130, processor 150 examines the data that has been collected to determine the angular position of the minimum displacement of a point along flat 68 and then causes chuck 46 to rotate the wafer so that flat 68 is oriented at a desired position.

Having centered wafer 62 upon chuck 46 relative to reference point 66 and oriented the wafer so that the discerning feature, flat 68, is at a desired angular orientation, manipulator arms 26 may pick up wafer 62 and move it to another station within wafer handling apparatus 10, positioning it at the next station with a precision limited only by the capabilities of centration station 44, the tolerance of the centration process, and the precision of manipulator arms 26 in moving an object. In an early prototype of the preferred embodiment, wafers have been centered upon chuck 46 with a precision of plus or minus 30 microns, and have been moved to another station and repositioned with an overall precision of plus or minus 50 microns. The angular positioning of a wafer has achieved a precision of plus or minus 1/10 of a degree. These tolerances are expected to improve as higher quality components are used both in centration station 44 and manipulator base 28/arms 26, and as optics are applied to the light source enclosed within hood 52 for better focus the light and sharpen the shadow produced by an object interposed between the light source and charge couple devices 50.

Although the charge couple devices 50 provide a relatively high resolution image of the perimeter of an object rotated upon chuck 46, other types of light-sensitive elements may be used to produce a signal corresponding to the edge of an object. For example, a plurality of closely spaced photo transistors could be used for this purpose. It is also possible to use an orthogonal or x-y array of light sensors to simultaneously sense the perimeter of an object at two points as it is rotated. To accommodate a larger range of wafer sizes, charge coupled devices 50 are mounted so that they may be positioned at a desired radius from reference point 66; however, a second charge coupled device array could be mounted at a different radius from point 66 and selectively connected to processor 150 in place of charge coupled devices 50 if a larger wafer is to be centered.

Figure 7:
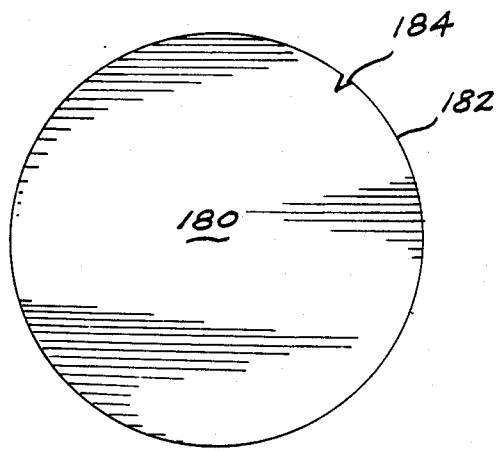
FIG. 7 shows in plan view a wafer having an alternative discerning feature.

Recently, semiconductor wafers using a notch rather than a flat for a discerning feature have come into use. An example of such a wafer 180 is shown in FIG. 7, having a substantially round perimeter 182 on which is disposed a small triangular notch 184. The advantage of notch 184 compared to flat 68 as shown on wafer 62 in FIG. 3, is that the notch provides a much more precise reference for angularly positioning wafer 180. The same algorithm discussed hereinabove applies equally well to wafer 180 for purposes of centering it and also for rotating it to a desired angular position relative to notch 184.

In addition to objects which are substantially round such as wafers 62 and 180, centration station 44 may also be used with objects of other shapes and form, as for example, a rectangularly shaped wafer (not shown). The process for centering such a rectangular wafer would be substantially the same as disclosed hereinabove, wherein one of the corners would represent a maximum displacement of the perimeter of the object from the reference point and the algorithm would be modified to compare the displacement of the four corners relative to the reference point to determine a distance over which the object should be moved. Once centered about the reference point 66, the rectangular object could be angularly oriented relative to any one of its flat sides using the same approach disclosed for wafer 62 having a discerning feature, flat 68.

An object need not be a planar object to be centered and aligned in centration station 44, so long as it can be rested in a stable manner upon chuck 46. A wafer having a pellicle on its upper surface can thus be centered in the manner already described.

An object that is generally round and has a discerning feature that protrudes radially from its circumference could be centered on chuck 46 by revising the algorithm disclosed previously so that the minimum displacement of a point on the perimeter of the object is used to determine a distance which the object should be shifted on chuck 46 by manipulator arms 26 to center the object. Accordingly, the maximum displacement would be used to angularly orient the discerning feature to a desired position.

While the invention has been described with respect to preferred embodiments and modifications thereto, it should be understood that further modifications and variations will be apparent to those skilled in the art. The present invention is therefore not to be limited to the embodiments and modifications described hereinabove, and the true scope and spirit of the invention should be determined by reference to the following claims.

The embodiments of the invention in which an exclusive property or privilege is claimed are defined as follows:

1. Apparatus for centering a wafer-like object relative to a reference point, comprising:
   (a) a rotatably driven support on which the wafer-like object is positioned, a diametrical extent of the rotatably driven support being substantially less than that of the wafer-like object so that a perimeter of the wafer-like object extends beyond that of the rotatably driven support, a rotational axis of the rotatably driven support being coincident with the reference point, the rotatably driven support including an angular position sensor for producing a signal indicative of the angular position of the rotatably driven support about its rotational axis;
   (b) an array of light sensors disposed adjacent the rotatably driven support, each light sensor being operative to produce a signal corresponding to the intensity of light incident on it;
   (c) a light source illuminating the wafer-like object and the array of light sensors and disposed so that the perimeter of the wafer-like object is intermediate the light source and the array of light sensors and casts a shadow on said array of light sensors;
   (d) a manipulator adapted to lift the wafer-like object from the rotatably driven support and to reposition it thereon; and
   (e) control means connected to the array of light sensors, the angular position sensor, the rotatably driven support, and the manipulator, and responsive to the signals produced by the angular position sensor and the array of light sensors, for:
      (i) causing the rotatably driven support to rotate, so that substantially the entire perimeter of the wafer-like object passes between the light source and the array of light sensors;
      (ii) in response to the signals produced by the light sensors in the array and by the angular position sensor, determining the angular position of the rotatably driven support where the perimeter of the wafer-like object is at one of a maximum and a minimum displacement relative to the reference point;
      (iii) determining a distance proportional to said one of the maximum and the minimum displacement, that the wafer-like object should be moved to bring a center of the wafer-like object into coincidence with the reference point; and
      (iv) causing the manipulator to lift the wafer-like object and to move it along said distance prior to returning it to the rotatably driven support.

2. The apparatus of claim 1, wherein the control means are further operative to cause the rotatably driven support to rotate the wafer-like object so that said one of the maximum and minimum displacements is disposed diametrically opposite the manipulator prior to causing the manipulator to lift the wafer-like object.

3. The apparatus of claim 1, wherein the wafer-like object includes one of a flat and an indent disposed on its perimeter and wherein the control means are operative to determine the angular position where the perimeter is at the maximum displacement from the reference point, and further operative after the manipulator has moved the wafer-like object, to determine the angular position of a point on the perimeter which is at a minimum displacement from the reference point, said point on the perimeter corresponding to a center of said one of the flat and the indent.

4. The apparatus of claim 1, wherein the wafer-like object includes a discerning feature on its perimeter and wherein after the center of the wafer-like object is moved into coincidence with the reference point, the control means are further operative:
   (a) to cause the rotatably driven support to rotate so that said discerning feature passes between the light source and the array of light sensors;
   (b) in response to the signals produced by the light sensors in the array and by the angular position sensor, to determine the angular position of the rotatably driven support where the perimeter of the wafer-like object is at the other of a maximum and a minimum displacement relative to the reference point; and
   (c) causing the rotatably driven support to rotate the wafer-like object so that said discerning feature corresponding to a part of the perimeter at which is located said other of the maximum and the minimum displacements is positioned at a desired orientation.

5. The apparatus of claim 1, wherein the array of light sensors comprise a charge coupled device.

6. The apparatus of claim 1, wherein the control means are operative to repeat functions (e)(i)–(e)(iv) of that claim to improve the accuracy with which the center of the wafer-like object is brought into coincidence with the reference point.

* * * * *